United States Patent
Lim (10) Patent No.: US 11,448,703 B2
(45) Date of Patent: Sep. 20, 2022

(54) DEVICE AND METHOD FOR ESTIMATING SOC VIA OPEN-CIRCUIT VOLTAGE OF BATTERY

(71) Applicant: LG CHEM, LTD., Seoul (KR)

(72) Inventor: Bo Mi Lim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 232 days.

(21) Appl. No.: 16/761,584

(22) PCT Filed: Feb. 1, 2019

(86) PCT No.: PCT/KR2019/001471
§ 371 (c)(1),
(2) Date: May 5, 2020

(87) PCT Pub. No.: WO2019/156457
PCT Pub. Date: Aug. 15, 2019

(65) Prior Publication Data
US 2020/0271729 A1    Aug. 27, 2020

(30) Foreign Application Priority Data
Feb. 7, 2018    (KR) .......................... 10-2018-0015152

(51) Int. Cl.
*H02J 7/00*       (2006.01)
*G01R 31/36*      (2020.01)
*G01R 31/3835*    (2019.01)

(52) U.S. Cl.
CPC ..... *G01R 31/3835* (2019.01); *G01R 31/3648* (2013.01); *H02J 7/0048* (2020.01)

(58) Field of Classification Search
CPC ............. G01R 31/3835; G01R 31/3648; H02J 7/0048
(Continued)

(56) References Cited
U.S. PATENT DOCUMENTS
4,327,157 A * 4/1982 Himy .................... H01M 50/46
                                                    429/61
5,278,487 A * 1/1994 Koenck .................. G06F 1/263
                                                   320/132
(Continued)

FOREIGN PATENT DOCUMENTS
CN    105548896 A  *  5/2016  ........... G01R 31/367
CN    107091990 A  *  8/2017  ........... G01R 31/382
(Continued)

OTHER PUBLICATIONS
International Search Report (PCT/ISA/210) issued in PCT/KR2019/001471, dated May 10, 2019.
(Continued)

*Primary Examiner* — John T Trischler
(74) *Attorney, Agent, or Firm* — Birch, Stewart, Kolasch & Birch, LLP (57) ABSTRACT
A state of charge (SOC) estimation method of a battery including: an SOC estimation device estimation mode checking step of checking an operation mode of an SOC estimation device; and an SOC estimation step of estimating an SOC of the battery according to an estimation mode of the SOC estimation device checked in the SOC estimation device operation mode checking step. The SOC estimation step estimates an SOC based on any one of an open circuit voltage during charging, an open circuit voltage during discharging, and an average open circuit voltage according to an estimation mode of the SOC estimation device.

4 Claims, 5 Drawing Sheets

US 11,448,703 B2
Page 2

(58) Field of Classification Search
USPC .......................................................... 320/132
See application file for complete search history.

(56) References Cited

U.S. PATENT DOCUMENTS

| | | | | |
|---|---|---|---|---|
| 5,432,429 | A * | 7/1995 | Armstrong, II | G01R 31/3648 320/136 |
| 5,508,599 | A * | 4/1996 | Koenck | H02J 7/00038 320/152 |
| 5,672,951 | A * | 9/1997 | Shiota | H02J 7/0078 320/132 |
| 5,889,386 | A * | 3/1999 | Koenck | H02J 7/0048 324/426 |
| 5,896,023 | A * | 4/1999 | Richter | H02J 7/14 324/429 |
| 5,986,435 | A * | 11/1999 | Koenck | H02J 7/0047 324/427 |
| 6,075,340 | A * | 6/2000 | Koenck | H02J 7/0072 320/135 |
| 6,252,380 | B1 * | 6/2001 | Koenck | G06F 1/263 320/150 |
| 6,307,349 | B1 * | 10/2001 | Koenck | H01M 10/4257 320/112 |
| 6,356,083 | B1 * | 3/2002 | Ying | G01R 31/3828 324/426 |
| 7,233,128 | B2 * | 6/2007 | Brost | H02J 7/1461 320/132 |
| 8,384,390 | B2 * | 2/2013 | Zhang | G01R 31/396 320/152 |
| 9,205,750 | B2 * | 12/2015 | Bernardi | B60L 53/00 |
| 9,310,441 | B2 * | 4/2016 | Jo | G01R 31/367 |
| 9,755,280 | B2 * | 9/2017 | Kaburagi | H02J 7/1461 |
| 10,018,683 | B2 * | 7/2018 | Yoon | H01M 10/48 |
| 10,073,146 | B2 * | 9/2018 | Joe | G01R 31/367 |
| 10,088,529 | B2 * | 10/2018 | Joe | G01R 31/367 |
| 10,147,983 | B2 * | 12/2018 | Kawahara | G01R 31/3828 |
| 10,191,115 | B2 * | 1/2019 | Rueger | G01R 31/3835 |
| 10,254,346 | B2 * | 4/2019 | Nishiguchi | G01R 31/44 |
| 10,295,604 | B2 * | 5/2019 | Oh | G01R 31/367 |
| 10,333,180 | B2 * | 6/2019 | Seo | H02J 7/00 |
| 10,466,303 | B2 * | 11/2019 | Nishigaki | G01R 31/3835 |
| 10,664,562 | B2 * | 5/2020 | Balasingam | G01R 31/3842 |
| 10,712,393 | B2 * | 7/2020 | Sejima | G01R 31/3835 |
| 10,718,814 | B2 * | 7/2020 | Seo | H01M 10/486 |
| 10,809,303 | B2 * | 10/2020 | Lee | G01R 31/28 |
| 10,884,065 | B2 * | 1/2021 | Lim | G01R 31/3842 |
| 10,895,605 | B2 * | 1/2021 | Kuroda | G01R 31/3842 |
| 10,989,761 | B2 * | 4/2021 | Montaru | H01M 10/425 |
| 11,079,437 | B2 * | 8/2021 | Shoa Hassani Lashidani | H02J 7/0068 |
| 11,079,440 | B2 * | 8/2021 | Ikeda | H02J 7/14 |
| 11,112,461 | B2 * | 9/2021 | Lim | H02J 7/0048 |
| 11,125,828 | B2 * | 9/2021 | Betzin | G01R 31/3835 |
| 11,181,584 | B2 * | 11/2021 | Ukumori | G01R 31/36 |
| 11,187,756 | B2 * | 11/2021 | Lim | G01R 31/3842 |
| 11,231,466 | B2 * | 1/2022 | Lim | G01R 31/36 |
| 2006/0022643 | A1 * | 2/2006 | Brost | G01R 31/367 320/132 |
| 2007/0229035 | A1 * | 10/2007 | Fukute | G01R 31/3648 320/132 |
| 2008/0100265 | A1 * | 5/2008 | Lim | H02J 7/00711 320/134 |
| 2009/0150101 | A1 * | 6/2009 | Itagaki | G01R 31/3648 702/63 |
| 2010/0324848 | A1 * | 12/2010 | Cho | B60L 3/0046 702/63 |
| 2011/0074433 | A1 * | 3/2011 | Zhang | G01R 31/396 324/429 |
| 2012/0217934 | A1 * | 8/2012 | Zhou | H01M 10/443 320/136 |
| 2012/0290236 | A1 * | 11/2012 | Majima | G01R 31/3835 702/63 |
| 2013/0138370 | A1 * | 5/2013 | Oh | G01R 31/3828 700/286 |
| 2013/0346000 | A1 * | 12/2013 | Joe | H02J 7/00711 324/426 |
| 2014/0074416 | A1 * | 3/2014 | Park | G01R 31/367 702/63 |
| 2014/0244193 | A1 * | 8/2014 | Balasingam | G01R 31/367 702/63 |
| 2014/0244225 | A1 * | 8/2014 | Balasingam | G06F 30/367 703/2 |
| 2014/0272653 | A1 * | 9/2014 | Chaturvedi | G01R 31/367 429/431 |
| 2014/0320141 | A1 * | 10/2014 | Kaburagi | H02J 7/1461 324/426 |
| 2015/0028808 | A1 * | 1/2015 | Bernardi | B60L 58/22 320/109 |
| 2015/0046107 | A1 * | 2/2015 | Jo | G01R 31/382 702/63 |
| 2015/0084639 | A1 * | 3/2015 | Joe | B60L 58/12 324/426 |
| 2015/0355285 | A1 * | 12/2015 | Nishigaki | B60L 3/12 324/429 |
| 2016/0178706 | A1 * | 6/2016 | Liu | G01R 31/392 702/63 |
| 2016/0245871 | A1 * | 8/2016 | Joe | G01R 31/367 |
| 2016/0252583 | A1 * | 9/2016 | Joe | G01R 31/367 702/63 |
| 2016/0259008 | A1 * | 9/2016 | Rueger | G01R 31/3835 |
| 2016/0351976 | A1 * | 12/2016 | Kawahara | H02J 7/0014 |
| 2017/0010327 | A1 * | 1/2017 | Nishiguchi | G01R 31/367 |
| 2017/0038436 | A1 * | 2/2017 | Montaru | G01R 31/367 |
| 2017/0153290 | A1 * | 6/2017 | Sazhin | G01R 31/396 |
| 2017/0199250 | A1 * | 7/2017 | Yoon | G01R 31/382 |
| 2017/0219657 | A1 * | 8/2017 | Vovos | H01M 10/425 |
| 2017/0254857 | A1 * | 9/2017 | Miyamoto | G01R 31/388 |
| 2018/0024199 | A1 * | 1/2018 | Lee | G01R 31/382 702/63 |
| 2018/0034285 | A1 * | 2/2018 | Baumgartner | H02J 7/007 |
| 2018/0069272 | A1 * | 3/2018 | Seo | H02J 7/00041 |
| 2018/0080990 | A1 * | 3/2018 | Seo | G01R 31/382 |
| 2019/0025377 | A1 * | 1/2019 | Sejima | G01R 31/3832 |
| 2019/0025381 | A1 * | 1/2019 | Kuroda | H02J 7/00 |
| 2019/0079136 | A1 * | 3/2019 | Lim | H01M 10/48 |
| 2019/0123394 | A1 * | 4/2019 | Cha | H01M 4/5825 |
| 2019/0170826 | A1 * | 6/2019 | Shoa Hassani Lashidani | G01R 31/3648 |
| 2019/0170827 | A1 * | 6/2019 | Shoa Hassani Lashidani | G01R 31/3835 |
| 2019/0187220 | A1 * | 6/2019 | Betzin | G01R 31/3835 |
| 2019/0219639 | A1 * | 7/2019 | Kawabe | H01M 10/448 |
| 2019/0346511 | A1 * | 11/2019 | Lim | G01R 31/374 |
| 2020/0003841 | A1 * | 1/2020 | Lim | G01R 31/385 |
| 2020/0003844 | A1 * | 1/2020 | Lim | H02J 7/0048 |
| 2020/0018798 | A1 * | 1/2020 | Ukumori | H02J 7/0021 |
| 2020/0018799 | A1 * | 1/2020 | Lim | H01M 10/0525 |
| 2020/0041574 | A1 * | 2/2020 | Ukumori | H01M 10/48 |
| 2020/0088807 | A1 * | 3/2020 | Ikeda | H01M 10/48 |
| 2020/0132782 | A1 * | 4/2020 | Hong | H02J 7/007182 |
| 2020/0150183 | A1 * | 5/2020 | Yoon | G01R 31/36 |
| 2020/0174079 | A1 * | 6/2020 | Chevrier | H01M 10/486 |
| 2020/0233037 | A1 * | 7/2020 | Yamamoto | G01R 31/392 |
| 2020/0335998 | A1 * | 10/2020 | Kawabe | H02J 7/0047 |
| 2020/0341071 | A1 * | 10/2020 | Kang | G01R 35/04 |
| 2020/0341072 | A1 * | 10/2020 | Nakamoto | H02J 7/00 |
| 2021/0033678 | A1 * | 2/2021 | Yun | G01R 31/374 |
| 2021/0116513 | A1 * | 4/2021 | Du | G01R 31/392 |
| 2021/0167616 | A1 * | 6/2021 | Lim | G01R 31/367 |
| 2021/0194253 | A1 * | 6/2021 | Lim | H01M 10/482 |
| 2021/0199724 | A1 * | 7/2021 | Kim | G01R 31/382 |
| 2021/0215767 | A1 * | 7/2021 | Lim | G01R 31/3842 |
| 2021/0247446 | A1 * | 8/2021 | Lim | H01M 10/486 |
| 2021/0249885 | A1 * | 8/2021 | Lim | H02J 7/007182 |
| 2021/0265674 | A1 * | 8/2021 | Doczy | G01R 31/389 |
| 2021/0349149 | A1 * | 11/2021 | Ide | H01M 10/425 |
| 2021/0364574 | A1 * | 11/2021 | Wei | G01R 31/367 |
| 2021/0384559 | A1 * | 12/2021 | Zhao | H01M 10/425 |
| 2021/0405120 | A1 * | 12/2021 | Hatano | H02J 7/00 |

(56) References Cited

U.S. PATENT DOCUMENTS

2022/0006314 A1* 1/2022 Lim .................. H02J 7/007194
2022/0026498 A1* 1/2022 Nishikawa ............ H01M 10/48

FOREIGN PATENT DOCUMENTS

| CN | 105548896 B | * | 4/2019 | ........... G01R 31/367 |
| CN | 108196200 B | * | 8/2020 | ........... G01R 31/367 |
| CN | 112213653 A | * | 1/2021 | ........... G01R 31/367 |
| CN | 113777501 A | * | 12/2021 | |
| JP | 2011-169817 A | | 9/2011 | |
| JP | 2013-37857 A | | 2/2013 | |
| JP | 2013-113852 A | | 6/2013 | |
| JP | 2014-59206 A | | 4/2014 | |
| JP | 2015-154639 A | | 8/2015 | |
| JP | 2015-158412 A | | 9/2015 | |
| JP | 2017-227653 A | | 12/2017 | |
| KR | 10-2014-0053590 A | | 5/2014 | |
| KR | 10-1547005 B1 | | 8/2015 | |
| KR | 10-2017-0063989 A | | 6/2017 | |
| KR | 10-1783919 B1 | | 10/2017 | |

OTHER PUBLICATIONS

Lee et al., D82, "Comparison of SOC estimation using EKF of the LiFePO$_4$ cell according to minor loop in individual SOC range", Proceedings of the KIPE Conference, Jul. 7, 2015, pp. 397-398.

\* cited by examiner

DEVICE AND METHOD FOR ESTIMATING SOC VIA OPEN-CIRCUIT VOLTAGE OF BATTERY

TECHNICAL FIELD

The present invention relates to a device and a method for estimating an SOC according to an operating state of a battery.

More particularly, the present invention relates to a device and method for accurately estimating an SOC based on an open-circuit voltage that is matched to an operating state of a battery.

BACKGROUND ART

Batteries are used in energy storage systems or uninterruptible power supply devices used in portable devices, electric vehicles, hybrid vehicles, and household or industrial applications.

In addition to the primary benefit of dramatically reducing the use of fossil fuels, there is no by-product of the use of energy. Therefore, these batteries are attracting attention as a new energy source for eco-friendliness and energy efficiency.

Meanwhile, a plurality of batteries may be connected in series and in parallel for high capacity and high output. When a plurality of such batteries are connected in series and in parallel to perform charging and discharging alternately, there is a need to control the charging and discharging of a plurality of batteries so that a plurality of batteries are managed to maintain an appropriate operating condition and performance.

For this, a battery management system (BMS) is provided to maintain the state and performance of the battery. The BMS measures the current, voltage, and temperature of the battery and, based on this, estimates the state of charge (SOC) of the battery to control the SOC so that battery condition and performance are maintained.

Therefore, in order to accurately control the SOC, it is necessary to accurately estimate the SOC of the battery that is being charged and discharged.

As a method for estimating the SOC of a conventional battery, there is a method of measuring the open circuit voltage (OCV) of a battery and based on this, estimating the SOC of the battery.

However, the OCV used in the conventional SOC estimation uses an average value of the OCV at the time of charging the battery and the OCV at the time of discharging the battery. However, the OCV of the battery varies by up to 50 mV when the battery is charged and discharged.

Therefore, when the SOC of the battery is estimated based on the average value of the OCV, there is a difference between the actual SOC of the battery when the battery is charged and the actual SOC of the battery when the battery is discharged.

Therefore, the present invention proposes a method for accurately determining the SOC of a battery by determining the operating state of the battery and using an OCV matching the operating state.

(Prior Art Document) Korean Patent Publication No. KR 1547005 B1

DISCLOSURE OF THE INVENTION

Technical Problem

The present invention is to provide a device and method for accurately estimating SOC of a battery using an open-circuit voltage matching an operation mode of a battery.

Technical Solution

Embodiments of the present invention provide a state of charge (SOC) estimation method of battery including: an SOC estimation device estimation mode checking step of checking an operation mode of an SOC estimation device; and an SOC estimation step of estimating an SOC of the battery according to an estimation mode of the SOC estimation device checked in the SOC estimation device operation mode checking step, wherein the SOC estimation step estimates the SOC based on any one of an open circuit voltage during charging, an open circuit voltage during discharging, and an average open circuit voltage according to an estimation mode of the SOC estimation device.

The estimation mode checking step of the SOC estimation device may check whether the estimation mode of the checked SOC estimation device is any one mode of a frequency adjustment battery SOC estimation mode for estimating the SOC of the battery having a low discharge depth when a charging and discharging pattern occurs as charging and discharging are repeated alternately at random and an SOC estimation mode for estimating the SOC of the battery having a high discharge depth when a process that a charging/discharging pattern is charged to a certain level or higher and is discharged to a certain level or less occurs continuously.

When the checked estimation mode of the SOC estimation device is checked as a normal power storage battery SOC estimation mode, the estimation mode checking step of the SOC estimation device may further include a charge/discharge checking step of checking whether the battery is in a charging or discharging state.

When the estimation mode of the SOC estimation device is Checked as the frequency adjustment battery SOC estimation mode, the SOC estimation step may estimate the SOC based on the average open circuit voltage.

As a result of the charge/discharge checking step, the SOC estimation step may estimate the SOC based on the open circuit voltage during charging when the battery is charged and estimate an SOC based on the open circuit voltage during discharging when the battery is discharged.

In other embodiments of the present invention, provided is a device for estimating an SOC of a battery. The device includes: a mode setting switch for setting an operation mode of an SOC estimation device; an operation triode checking unit for checking the operation mode of the SOC estimation device and a charging/discharging state of the battery; a selection unit for selecting an average open circuit voltage, an open circuit voltage during charging, and an open circuit voltage during discharging according to the operation mode of the battery; and an SOC estimation unit for estimating an SOC of the battery based on the open circuit voltage selected in the selection unit.

The operation mode checking unit may include: a mode checking module for checking whether the SOC estimation unit operates in any one mode of a frequency adjustment mode; or a normal power storage mode based on a position of the mode setting switch; and a charging/discharging state checking module for checking whether the battery is in a charging or discharging state, wherein the mode checking module may transmit a frequency adjustment mode signal to the selection unit when the SOC estimation unit operates in the frequency adjustment mode, and transmit a normal power storage mode signal to the selection unit when the SOC estimation device operates in the normal power storage mode, wherein the charging/discharging state checking module may transmit a charge state signal to the selection unit when the battery is in the charging state, and transmit a discharge state signal to the selection unit when the battery is in the discharging state.

The selection unit may select the average open circuit voltage when the operation mode checking unit receives the frequency adjustment mode signal, select the open circuit voltage during charging when the operation mode checking unit receives the charge state signal and the normal power storage mode signal, and select the open circuit voltage during discharging when the operation mode checking unit receives the discharge state signal and the normal power storage mode sural.

The SOC estimation unit may estimate the SOC of the battery by substituting the open circuit voltage selected in the base selection unit into the extended Kalman filter.

Advantageous Effects

The present invention may accurately estimate the SOC of a battery by using an open-circuit voltage matching the operation mode of the battery.

In addition, the present invention may accurately estimate the SOC of the battery, thereby improving the battery use efficiency.

MODE FOR CARRYING OUT THE INVENTION

Hereinafter, embodiments of the present invention will be described in detail with reference to the accompanying drawings so that those skilled in the art may easily carry out the present invention. The present invention may, however, be embodied in different forms and should not be construed as limited to the embodiments set forth herein. Parts not relating to description are omitted in the drawings in order to clearly describe the present invention and like reference numerals refer to like elements throughout.

Although the terms "initial," "second," etc., may be used herein to describe various elements, these elements should not be limited by these terms. The above terms are used only to distinguish one component from another. For example, an initial component may be referred to as a second component and vice versa without departing from the scope of the present invention. Terms used in this specification are used to describe specific embodiments, and are not intended to limit the scope of the present invention. The singular expressions include plural expressions unless the context clearly dictates otherwise.

Throughout the specification, when a portion is referred to as being "connected" to another portion, it includes not only "directly connected" but also "electrically connected" with another element therebetween. Furthermore, when it is described that one comprises (or includes or has) some elements, it should be understood that it may comprise (or include or has) only those elements, or it may comprise (or include or have) other elements as well as those elements when there is no specific limitation. The term "~ing operation" or "operation of ~ing" used throughout the specification does not mean "operation for ~ing".

Terms used in this specification may be currently widely used general terms in consideration of functions in the present invention but may vary according to the intents of those skilled in the art, precedents, or the advent of new technology. Additionally, in certain cases, there may be terms the applicant selects arbitrarily and in this case, their meanings are described in a corresponding description part of the present invention. Accordingly, terms used in the present invention should be defined based on the meaning of the term and the entire contents of the present invention instead of the simple term name.

1. Method for Estimating SOC of Battery According to Embodiment of Present invention.

Figure 1:
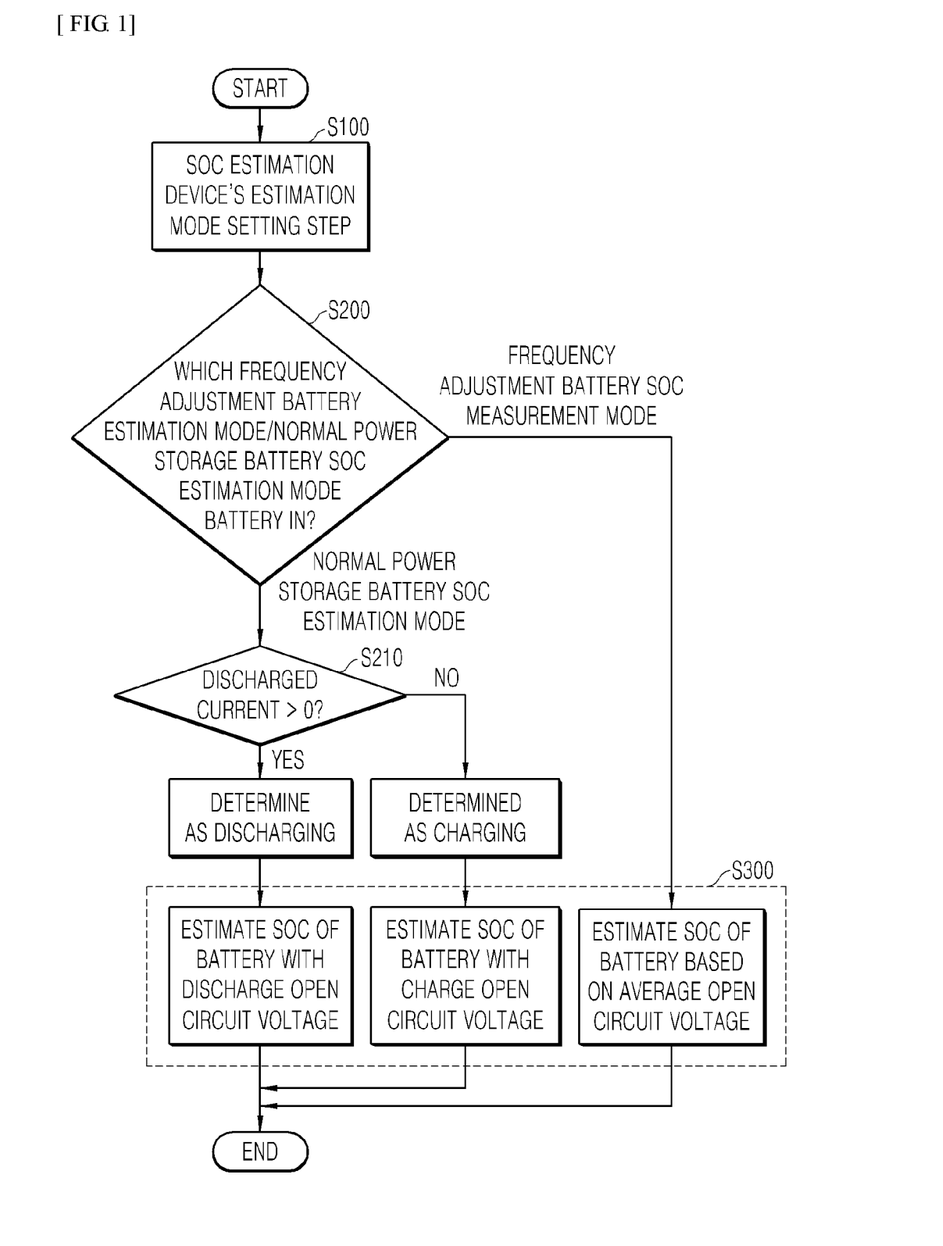
FIG. 1 is a flowchart illustrating an SOC estimation method of a battery according to an embodiment of the present invention.

FIG. 1 is a view illustrating an SOC estimation method of a battery according to an embodiment of the present invention.

The present invention differently applies an open-circuit voltage (OCV) used to estimate the SOC of a battery according to the operation mode of the battery.

Specifically, the present invention is an invention for accurately estimating the SOC of a battery based on each open-circuit voltage (OCV) matching the charging/discharging state of the battery.

Theoretically, the OCV of a battery should have a value, regardless of whether it is charging or discharging. However, there is a difference between the OCV measured at the time of charging the actual battery and the OCV measured at the time of discharging.

The reason why the OCV varies depending on the charge/discharge state of the battery is that the resistance value is accumulated in the charging direction when the battery is charged, and the resistance value is accumulated in the discharging direction when the battery is discharged. The accumulated resistance returns to its original state after a predetermined period. However, in order to manage battery state and performance, since it is necessary to measure the OCV of the battery in real time, the OCV of the battery should be measured when the resistance value is accumulated in one direction by charging or discharging. Therefore, there is a difference between the OCV measured during charging and the OCV measured during discharging.

Figure 2:
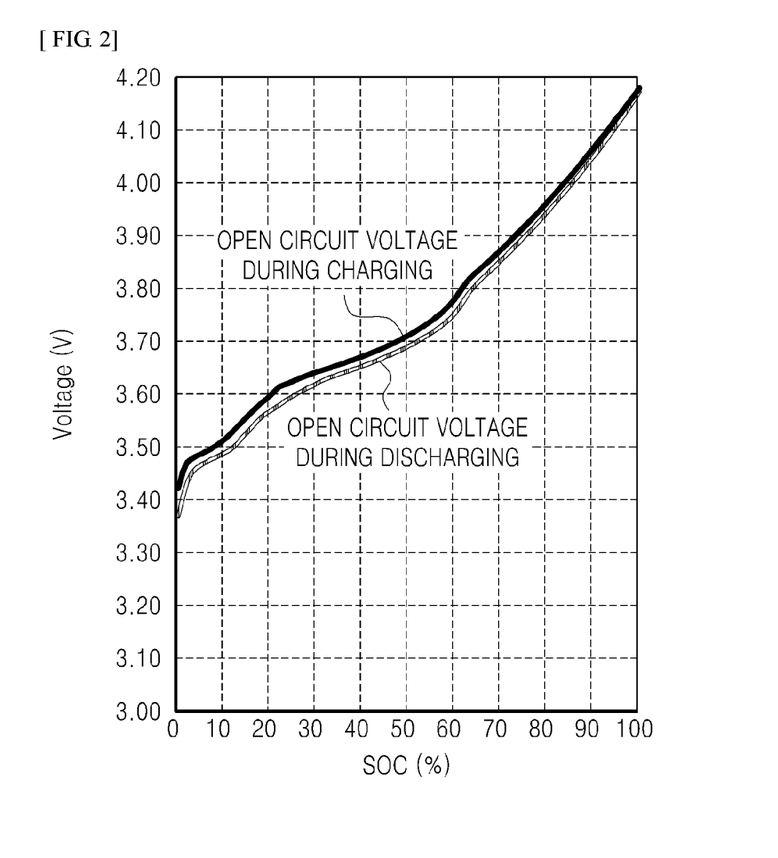
FIG. 2 is a graph showing an open-circuit voltage at the time of charging or discharging the battery.

FIG. 2 is a graph showing the OCV measured at the time of actual charging or discharging.

Referring to FIG. 2, it may be checked that the difference between the OCV during charging and the OCV during discharging reaches a maximum of 50 mV.

Meanwhile, in spite of the difference of OCV occurring during charging/discharging, since the SOC of the battery is conventionally estimated by the average value of OCV during charging and discharging, there is an error with the actual SOC value of the battery.

Therefore, in the present invention, depending on the determination of the operation mode of the battery, the SOC of the battery is estimated based on the OCV matched to the battery state.

1.1 Battery Usage Determination and Device's Estimation Mode Setting Step (S100)

The battery is applied to the frequency control device and shows different operation patterns when it is used in frequency adjustment mode and when it is used in a normal power storage mode.

Specifically, the battery operating in the frequency adjustment mode shows a pattern having a low discharge depth because the charge/discharge pattern repeatedly occurs in a specific SOC as charging or discharging occurs alternately and repeatedly at random. In other words, in the frequency adjustment mode, since charging and discharging are randomly changed over a short period of time, the resistance does not accumulate in either the charging or discharging direction. Therefore, when the battery operates in the frequency adjustment mode, even when the SOC of the battery is estimated using the average OCV, the error does not occur.

That is, when the battery operates in the frequency adjustment mode, since the difference between OCV during charging and OCV during discharging is not large, even when the SOC of the battery is estimated using the average OCV, there is almost no error with the actual SOC of the battery.

On the other hand, a battery operating in a normal power storage mode shows a pattern having a high discharge depth because a charge/discharge pattern is charged to a certain level or higher, and a process of discharging to a certain level or less occurs continuously. In other words, charging or discharging occurs continuously for a predetermined period of time, so that the resistance is accumulated in the charging or discharging direction. Therefore, since there is a difference between OCV during charging and OCV during discharging, when estimating the SOC of the battery, when the OCV at the time of charging and the OCV at the time of discharging are not separately used, the estimated SOC of the battery may be significantly different from the actual SOC of the battery.

Due to the above reason, in the SOC estimation method of the present invention, the measurement element value is varied depending on whether the battery is used in a frequency adjustment mode or in a normal power storage mode.

Therefore, in the battery usage determination and an estimation mode setting step of the SOC estimation device, the present invention requires a process of determining the usage of the battery and setting the estimation mode of the SOC estimation device so as to match the determined use of the battery.

For example, the process of setting the estimation mode of the SOC estimation device may set the estimation mode of the SOC estimation device by controlling the position of the mode adjustment switch included in the SOC estimation device.

1.2 SOC Estimation Device's Estimation Mode Checking Step (S200)

The estimation mode checking step of the SOC estimation device of the present invention is a step of checking the estimation mode of the SOC device set in the battery usage determination and the estimation mode setting step of the SOC estimation device.

For example, the estimation mode checking step of the SOC estimation device may be checked by detecting whether the mode adjustment switch is in a frequency adjustment battery SOC estimation mode or a normal power storage battery SOC estimation mode.

1.2.1 Charge/Discharge Checking Step (S210)

Meanwhile, when the SOC estimation device operates in a normal power storage battery SOC estimation mode in the measurement mode checking step of the SOC estimation device, the estimation mode checking step of the SOC estimation device includes a charge/discharge checking step for checking whether the battery is being charged or discharged.

The charge/discharge checking step determines that the battery is discharged when a current flows from the battery to the external device in the BMS of the battery, and determines that the battery is charged when current flows from the outside to the battery.

Then, when it is determined that the battery is discharged, the SOC of the battery may be estimated based on the OCV during discharging, and when it is determined that the battery is charged, the SOC of the battery may be estimated based on the OCV during charging.

1.3 SOC Estimation Step (S300)

The SOC estimation step of the present invention may estimate the SOC of the battery based on any one of the charging OCV, the discharging OCV, and the average OCV according to the operation mode of the battery.

A method of estimating the SOC of a battery using a specific OCV may start by selecting an estimation mode of the SOC estimation device checked in the estimation mode determination step of the SOC estimation device and the charge/discharge checking step and an OCV (any one of average OCV, OCV during charging, and OCV during discharging) matching the charging/discharging state of the battery.

Then, the SOC of the battery may be estimated by substituting the selected OCV into the extended Kalman filter algorithm.

The extended Kalman filter (EKF) SOC estimation algorithm is a method of estimating the SOC through active compensation by electrically modeling a battery and comparing the theoretical output value of the battery model with the actual output value. The input values of the EKF SOC estimation algorithm are voltage, current, and temperature, and the output value is SOC. Since the EKF SOC estimation algorithm is a well-known algorithm through a large number of data known in the art, a detailed description of the process of SOC estimation in the EKF SOC estimation algorithm will be omitted.

Figure 3:
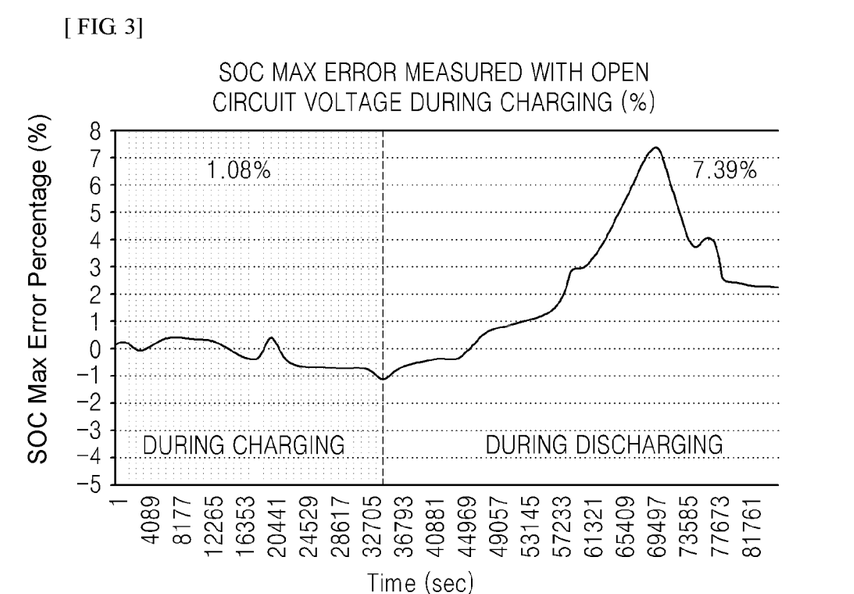
FIG. 3 is a graph showing errors of a result of an SOC estimation of a battery using an open-circuit voltage during charging in a normal power storage battery SOC estimation mode and an SOC of an actually measured battery.
Figure 4:
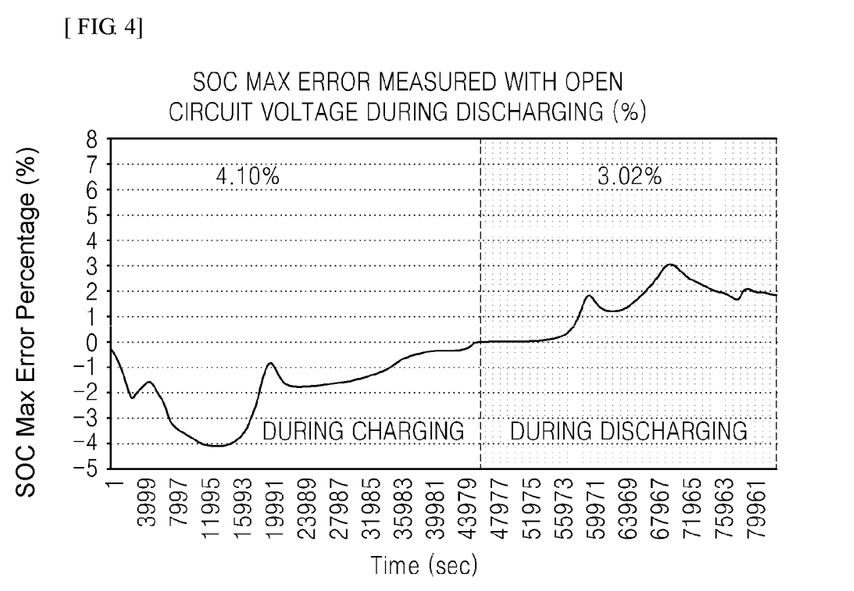
FIG. 4 is a graph showing errors of a result of an SOC estimation of a battery using an open-circuit voltage during discharging in a normal power storage battery SOC estimation mode and an SOC of an actually measured battery.

1.4 Specific Performance Result Data

Meanwhile, FIG. 3 is a graph showing errors of a result of an SOC estimation of a battery using an OCV during charging in a normal power storage battery SOC estimation mode and an SOC of an actually measured battery. FIG. 4 is a graph showing errors of a result of an SOC estimation of a battery using an OCV during discharging in a normal power storage battery SOC estimation mode and an SOC of an actually measured battery.

Figure 5:
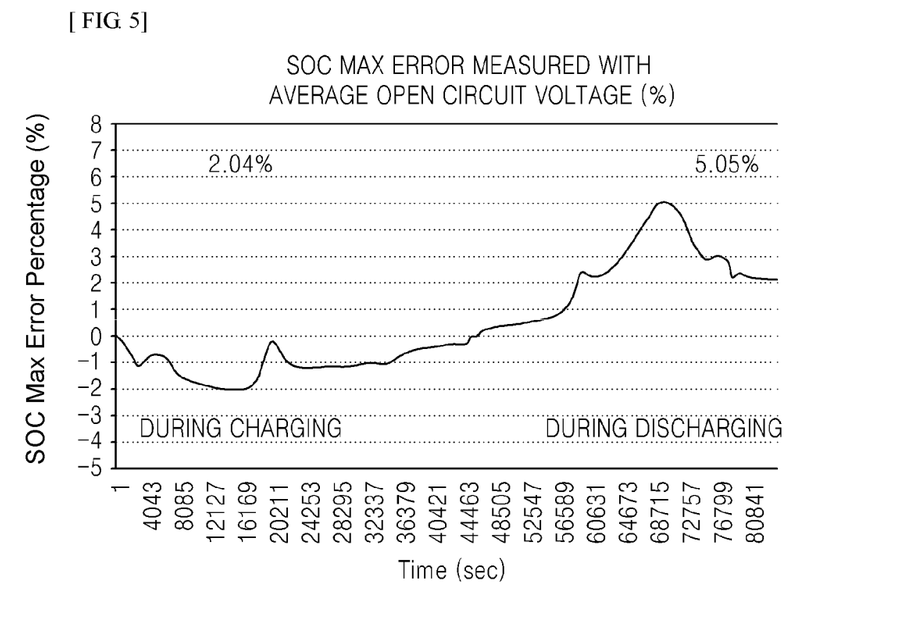
FIG. 5 is a graph showing an error of a result of an SOC estimation of a battery at an average voltage and an actual SOC of the battery in the battery operating in the normal power storage mode.

Meanwhile, FIG. 5 is a graph showing errors of a result of an SOC estimation of a battery using an average OCV in a normal power storage battery SOC estimation mode and an SOC of an actually measured battery.

First, referring to FIG. 3, it may be checked that when using the OCV during charging, an error of up to 1.08% occurs while the battery is charged and an error of up to 7.39% occurs while the battery is discharged.

Next, referring to FIG. 4, it may be checked that when using the OCV during discharging, an error of up to 4.10% occurs while the battery is charged and an error of up to 3.02% occurs while the battery is discharged.

Next, referring to FIG. 5, it may be checked that when using the average OCV during discharging, an error of up to 2.04% occurs while the battery is charged and an error of up to 5.05% occurs while the battery is discharged.

With reference to FIGS. 3 to 5, in a normal power storage battery SOC estimation mode, in order to reduce the difference between the actual SOC of the battery and the SOC estimated from the OCV, when the battery is charged, OCV at charging is used, and when the battery is discharged, OCV at discharging is used and, based on this, the SOC of the battery should be estimated so that it may be checked that the error is small.

2. Device for Estimating SOC of Battery According to Embodiment of Present Invention.

Figure 6:
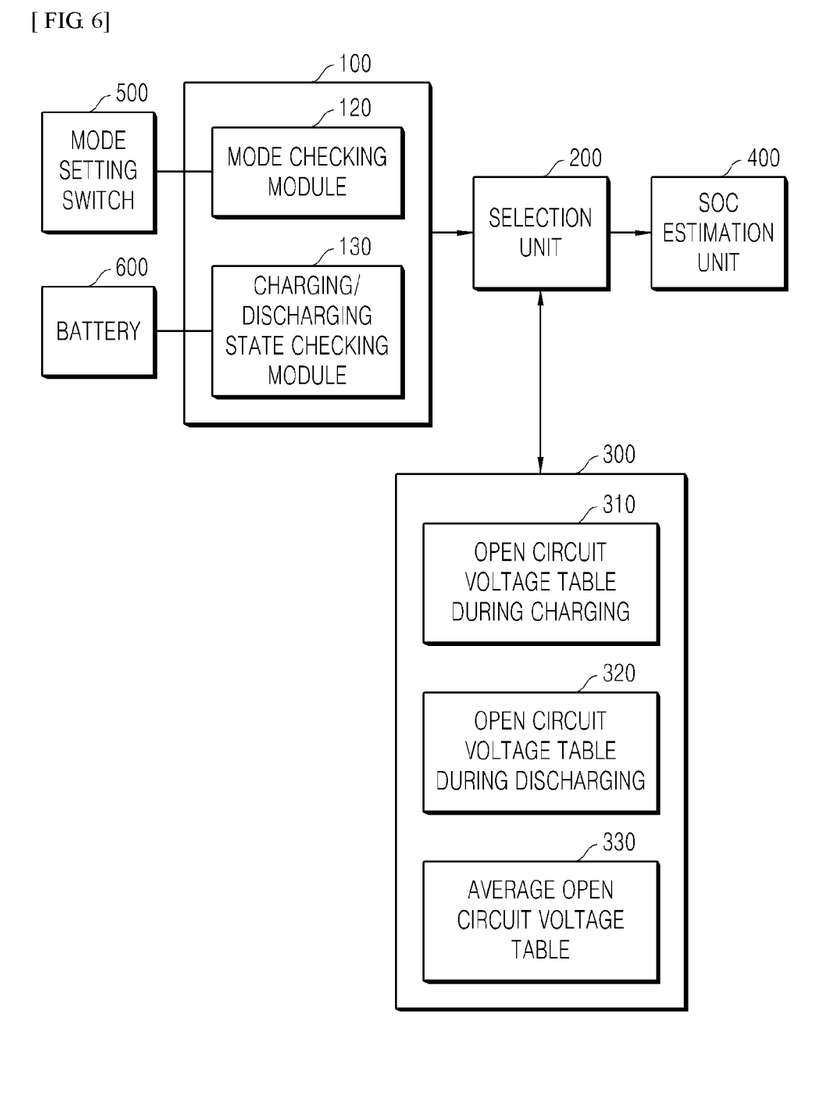
FIG. 6 is a block diagram illustrating a device for estimating an SOC of a battery according to an embodiment of the present invention.

FIG. 6 is a block diagram illustrating a device for estimating an SOC of a battery according to an embodiment of the present invention.

A device for estimating an SOC of a battery according to an embodiment of the present invention includes an operation mode checking unit for checking the operation mode of the battery, a selection unit for selecting one of an average OCV, an OCV during charging, and an OCV during discharging according to an operation mode of the battery, and an SOC estimation unit for estimating the SOC of the battery based on the OCV selected in the selection unit.

2.1 Mode Setting Switch (500)

The mode setting switch of the present invention is a switch for setting an operation mode of the SOC estimation device. The mode setting switch may select either a frequency adjustment mode or a normal power storage mode according to the application in which the battery 600 is used.

For example, the mode setting switch of the present invention may set the operation mode of the SOC estimation device to either the frequency control mode or the normal power storage mode according to the position.

Batteries have different operating patterns when used in frequency control devices and when used in normal power storage devices.

Specifically, the battery applied to the frequency adjustment device shows a pattern having a low discharge depth because the charge/discharge pattern repeatedly occurs in a specific SOC as charging or discharging occurs alternately and repeatedly at random. In other words, since the battery applied to the frequency adjustment device is randomly changed over a short period of time during charging and discharging, the resistance does not accumulate in either the charging or discharging direction. Therefore, when the battery is applied to the frequency adjustment device, even when the SOC of the battery is estimated using the average OCV, the error does not occur.

That is, when the battery is applied to the frequency adjustment device, since the difference between OCV during charging and OCV during discharging is not large, even when the SOC of the battery is estimated using the average OCV, there is almost no error with the actual SOC of the battery.

On the other hand, a battery applied to a normal power storage device shows a pattern having a high discharge depth because a charge/discharge pattern is charged to a certain level or higher, and a process of discharging to a certain level or less occurs continuously. In other words, charging or discharging occurs continuously for a predetermined period of time, so that the resistance is accumulated in the charging or discharging direction. Therefore, since there is a difference between OCV during charging and OCV during discharging, when estimating the SOC of the battery applied to the normal power storage device, when the OCV at the time of charging and the OCV at the time of discharging are not separately used, the estimated SOC may be significantly different from the actually measured SOC.

Due to the above reason, the SOC estimation method of the present invention changes the estimation mode of the SOC estimation device depending on whether the battery is applied to the frequency adjustment device or the normal power storage device.

For this, setting for which estimation mode the SOC estimation device is used using the mode setting switch is required.

2.2 Operation Mode Checking Unit (100)

The operation mode checking unit of the present invention includes a mode checking module for checking which operation mode the SOC estimation device is set according to the position of the mode setting switch, and a charge/discharge checking module for checking the charge/discharge state of the battery.

2.2.1 Mode Checking Module (120)

The mode checking module of the present invention may check the operation mode of the SOC estimation device by checking the position of the mode setting switch. Accordingly, in the present invention, when the mode checking module checks the position of the mode setting switch and the mode setting switch is located in the frequency adjusting mode, a frequency control mode signal may be generated and transmitted to the selection unit, and when the mode setting switch is set to the normal power saving mode position, the power save mode signal may be generated and transmitted to the selection unit.

2.2.2 Charging/Discharging State Checking Module (130)

The charging/discharging state checking module of the present invention measures the current supplied from the battery to the external device based on the battery, so that it may check the charge/discharge state of the battery. Specifically, when the current supplied from the battery to the external device is larger than 0, it is checked as a discharging state and thus, a discharging state signal may be transmitted to the selection unit, and when the current supplied from the battery to the external device is less than 0, since the flow of current is reversed, it is checked as a charging state and thus, a charging state signal may be transmitted to the selection unit.

Meanwhile, the charging/discharging state checking module of the present invention is implemented in a separate module form as described above, but it is not implemented as a separate module type, and may be implemented using a charging/discharging state signal measured in a BMS that is basically installed in a battery. Since the BMS senses information on the charging/discharging state of the battery, it may not have a separate charging/discharging state checking module and may transmit the battery charging/discharging state signal to the selection unit in the BMS.

2.3 Selection Unit (200)

The selection unit of the present invention is a configuration for selecting an OCV used in a SOC estimation unit described below based on a signal received from the operation mode checking unit, and is a configuration for selecting the OCV matching the state of the current battery in the OCV table according to the state of the battery stored in the memory.

The OCV table according to the battery state stored in the memory 300 may include an OCV table 310 during charge, an OCV table 320 during discharge, and an average OCV table 330

For example, when the battery receives the frequency adjustment mode signal from the operation mode checking unit, it may select an average OCV matching a current battery state in an average OCV table stored in the memory. When the battery receives the charge state signal and the normal power storage mode signal from the operation mode checking unit, it may select an OCV during charging that matches a current battery state in the OCV table during charging stored in the memory. When the battery receives the discharge state signal and the normal power save mode signal from the operation mode checking unit, it may select an OCV during discharging that matches the current battery state in the OCV table at the time of discharging stored in the memory.

The reason why the OCV used for SOC estimation is selected differently is to reduce the error between the finally estimated SOC of the battery and the actual SOC of the battery.

FIG. 3 is a graph showing an error of a result of an SOC estimation of the battery and an SOC of the actual battery by the OCV when charging the battery operated in the normal power storage mode, and FIG. 4 is a graph showing an error of a result of an SOC estimation of the battery and an SOC of the actual battery by the OCV when discharging the battery operated in the normal power storage mode.

Meanwhile, FIG. 5 is a graph showing an error of a result of an SOC estimation of a battery at an average voltage and an actual SOC of the battery in the battery operating in the normal power storage mode.

First, referring to FIG. 3, it may be checked that when using the OCV during charging, an error of up to 1.08 occurs while the battery is charged and an error of up to 7.39 occurs while the battery is discharged.

Next, referring to FIG. 4, it may be checked that when using the OCV during discharging, an error of up to 4.10 occurs while the battery is charged and an error of up to 3.02 occurs while the battery is discharged.

Next, referring to FIG. 5, it may be checked that when using the average OCV, an error of up to 2.04 occurs while the battery is charged and an error of up to 5.05 occurs while the battery is discharged.

As a result, in a battery operating in a normal power storage mode, in order to reduce the difference between the actual SOC of the battery and the SOC estimated from the OCV, when the battery is charged, OCV at charging is used, and when the battery is discharged, OCV at discharging is used and, based on this, the SOC of the battery should be estimated so that it may be checked that the error is small.

2.4 SOC Estimation Unit (400)

The SOC estimation unit of the present invention may estimate the SOC of the battery by substituting the OCV selected in the above selection unit into the extended Kalman filter SOC estimation algorithm.

The extended Kalman filter (EKF) SOC estimation algorithm is a method of estimating the SOC through active compensation by electrically modeling a battery and comparing the theoretical output value of the battery model with the actual output value. The input values of the EKF SOC estimation algorithm are voltage, current, and temperature, and the output value is SOC. Since the EKF SOC estimation algorithm is a well-known algorithm through a large number of data known in the art, a detailed description of the process of SOC estimation in the EKF SOC estimation algorithm will be omitted.

Meanwhile, although the SOC estimation device of the battery is described as a separate device in the above example, the configuration of the SOC estimation device of the battery may be integrated with the BMS mounted on the battery.

By integrating with the BMS, it is possible to use the state information of the battery measured by the BMS. Further, by using the state information of the battery measured by the BMS, there is no need to separately configure a structure for measuring the state of the battery, so that the internal space of the battery may be efficiently used.

On the other hand, although the technical idea of the present invention is specifically described with reference to the above embodiments, it should be noted that the above embodiments are for the purpose of explanation and not for the purpose of limitation. It will be apparent to those skilled in the art that various modifications and variations may be made in the present invention without departing from the spirit and scope of the invention.

The invention claimed is:

1. A state of charge (SOC) estimation method of a battery comprising:
   selecting, by a battery management system (BMS), an estimation mode among the following:
   a frequency adjustment battery SOC estimation mode in response to the battery having a low discharge depth when a charging and discharging pattern occurs as charging and discharging are repeated alternately at random; and
   a normal power storage battery SOC estimation mode in response to the battery having a high discharge depth when a process that the charging and discharging pattern is charged to a first predetermined level or higher and is discharged to a second predetermined certain level or less occurs continuously for a predetermined period of time;
   estimating, by the BMS, a SOC of the battery according to the determined estimation mode; and
   controlling, by the BMS, the charging and discharging of the battery based on the estimated SOC of the battery,
   wherein in response to the estimation mode being the frequency adjustment battery SOC estimation mode, the SOC of the battery is estimated based on an average open circuit voltage,
   wherein in response to the estimation mode being the normal power storage battery SOC estimation mode:
   during charging, the SOC of the battery is estimated based on a charging open circuit voltage; and
   during discharging, the SOC of the battery is estimated based on a discharging open circuit voltage, and
   wherein the BMS estimates the SOC of the battery by inputting one of the average open circuit voltage, the charging open circuit voltage and the discharging open circuit voltage into an extended Kalman filter.

2. The method of claim 1, wherein in response to the estimation mode being the normal power storage battery SOC estimation mode, the BMS determines whether the battery is in a charging state or discharging state.

3. A battery management system (BMS) for estimating an SOC of a battery, the BMS being configured to:
- select, by the BMS, an estimation mode among the following:
  - a frequency adjustment battery SOC estimation mode in response to the battery having a low discharge depth when a charging and discharging pattern occurs as charging and discharging are repeated alternately at random; and
  - a normal power storage battery SOC estimation mode in response to the battery having a high discharge depth when a process that the charging/discharging pattern is charged to a first predetermined level or higher and is discharged to a second predetermined certain level or less occurs continuously for a predetermined period of time;
- estimate a SOC of the battery according to the determined estimation mode; and
- control the charging and discharging of the battery based on the estimated SOC of the battery,
- wherein in response to the estimation mode being the frequency adjustment battery SOC estimation mode, the SOC of the battery is estimated based on an average open circuit voltage,
- wherein in response to the estimation mode being the normal power storage battery SOC estimation mode, the SOC of the battery is estimated based a charging open circuit voltage during charging and a discharging open circuit voltage during discharging,
- wherein the BMS estimates the SOC of the battery by inputting one of the average open circuit voltage, the charging open circuit voltage and the discharging open circuit voltage into an extended Kalman filter.

4. The device of claim 3, wherein in response to the estimation mode being the normal power storage battery SOC estimation mode, the BMS determines whether the battery is in a charging state or discharging state.

* * * * *